United States Patent [19]

Hiwada

[11] Patent Number: 5,597,982
[45] Date of Patent: Jan. 28, 1997

[54] ELECTRICAL CONNECTION STRUCTURE

[75] Inventor: Kiyoyasu Hiwada, Yamato, Japan

[73] Assignee: Hewlett-Packard Company, Palo Alto, Calif.

[21] Appl. No.: 398,345

[22] Filed: Mar. 3, 1995

[30] Foreign Application Priority Data

Mar. 6, 1994 [JP] Japan ................................. 6-062018

[51] Int. Cl.$^6$ .................................................. H05K 1/02
[52] U.S. Cl. ...................... 174/261; 174/254; 361/777; 361/767; 439/65
[58] Field of Search .................................... 174/254, 261; 361/749, 777, 767, 768, 769, 770, 774; 439/65, 66, 67, 77, 78

[56] References Cited

U.S. PATENT DOCUMENTS

| | | | |
|---|---|---|---|
| 3,781,764 | 12/1973 | Johnson | 339/94 |
| 4,597,177 | 7/1986 | Baldauf et al. | 29/878 |
| 4,833,568 | 5/1989 | Berhold | 361/383 |
| 4,899,106 | 2/1990 | Ogura | 324/158 F |
| 4,975,639 | 12/1990 | Hiwada et al. | 324/158 P |
| 5,057,969 | 10/1991 | Ameen et al. | 361/386 |
| 5,083,697 | 1/1992 | Difrancesco | 228/116 |
| 5,180,311 | 1/1993 | Schreiber et al. | 439/74 |
| 5,259,770 | 11/1993 | Bates et al. | 439/66 |
| 5,295,853 | 3/1994 | Nagakusa et al. | 439/330 |
| 5,478,973 | 12/1995 | Yoon et al. | 174/260 |
| 5,523,920 | 6/1996 | Machuga et al. | 361/767 |

OTHER PUBLICATIONS

AMP Japan, Apr. 1992, H. Sakamoto, "Project AMPSTAR Connector", (pp. 1–165).
Shinetsu Interconnector, 1993.4, ShinEtsu Polymer Co. (product pamphlet), pp. 1–2.
Exatron Automatic Test Equipment, Nov. 1993 (?), Exatron Co., "Particle Interconnect", (pp. 1–4).
ICEMM Proceedings '93, Apr. 1993, S. Martin et al., "A Practical Approach to Producing Known–Good Die", (pp. 139–151).
Hewlett–Packard Journal, Oct. 1993, D. T. Hamling, Pr. 43.3, "A 3 GHZ, 144 Point Probe Fixture for Automatic IC Wafer Testing" (pp. 940–947).
Hewlett–Packard Journal, Jun. 1990, B. Leslie et al., Pr. 30.1, "Advances in IC Testing: The Membrane Probe Card" (pp. 77–85), and Membrane Probe Card Technology, (pp. 601–607).
Proceedings Of ISHM '93, Oct. 1993, Y. Yamamoto et al., "Evaluation of New Micro–Connection System Using Microbumps", (pp. 1–9).
IEDM '92 Proceedings, Apr. 1992, M. A. Beiley et al., "Micro–Machined Array Probe Card", (pp. 509–512).
Nitto Technical Report, vol. 30, No. 1 (May 1992), M. Sugimoto et al.–"Ultra High Density Anisotropic Conductive Film" (pp. 45–47).
Nitto Denko, Jan. 1992 (?), M. Sugimoto, "ASMAT Application Specific Material", (pp. 1–16).
Probe Technology, Feb. 1992, J. Kister et al., "Test Cost Reduction Using the Membrane Probe", (pp. 2–15).

*Primary Examiner*—Laura Thomas

[57] ABSTRACT

The present invention provides an electrical connection structure for an electrical connection with high density and reliability, and which is particularly superior in high frequency characteristics and prevents any leakage current at the contact.

Preferred embodiment includes a dielectric film and a first conductor pattern having one or plural microconductor protrusions which is formed on dielectric film, an elastic member which is provided on the other side of dielectric film, thereby an electrical connection is accomplished by pressing a contacting surface of first conductor pattern by a force exerted through elastic member. The distance between microconductor protrusions may be changed during a contacting operation and microconductor protrusions will scratch a surface of a conductor to be contacted, e.g. a pad, a line pattern while a distance and thickness of compression are under control.

15 Claims, 9 Drawing Sheets

FIG. 14.
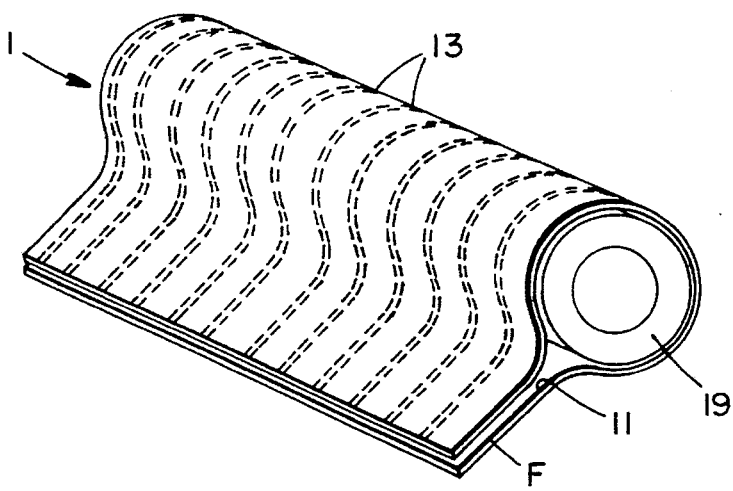
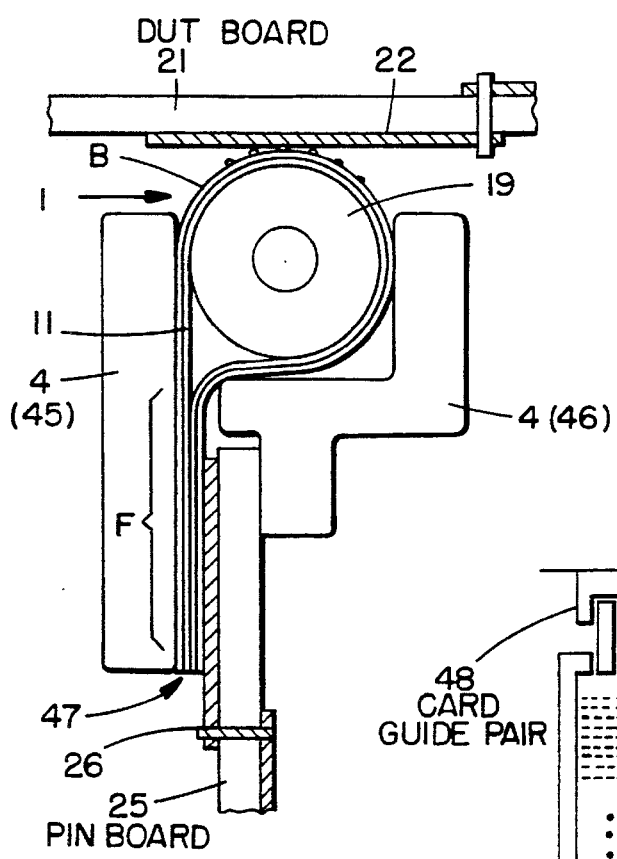
FIG. 15.
FIG. 16.
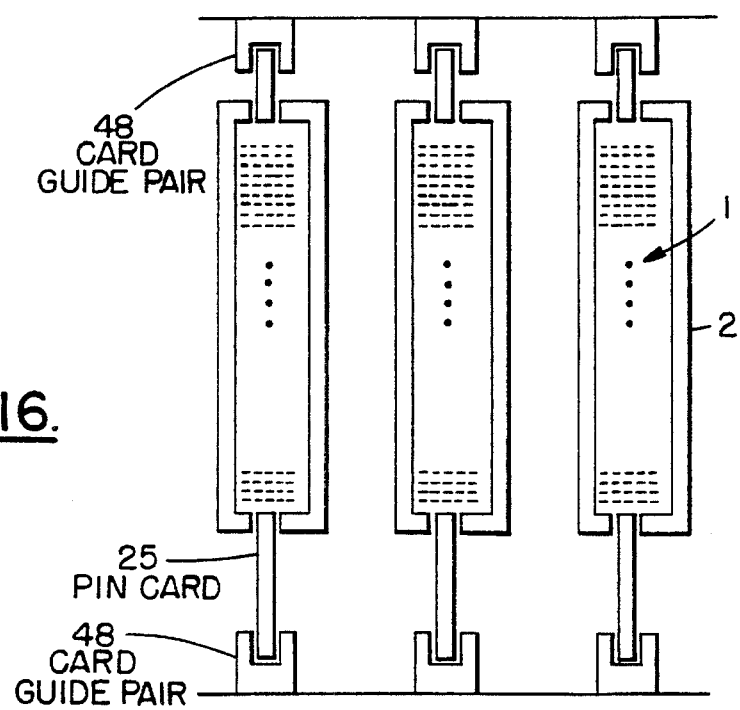

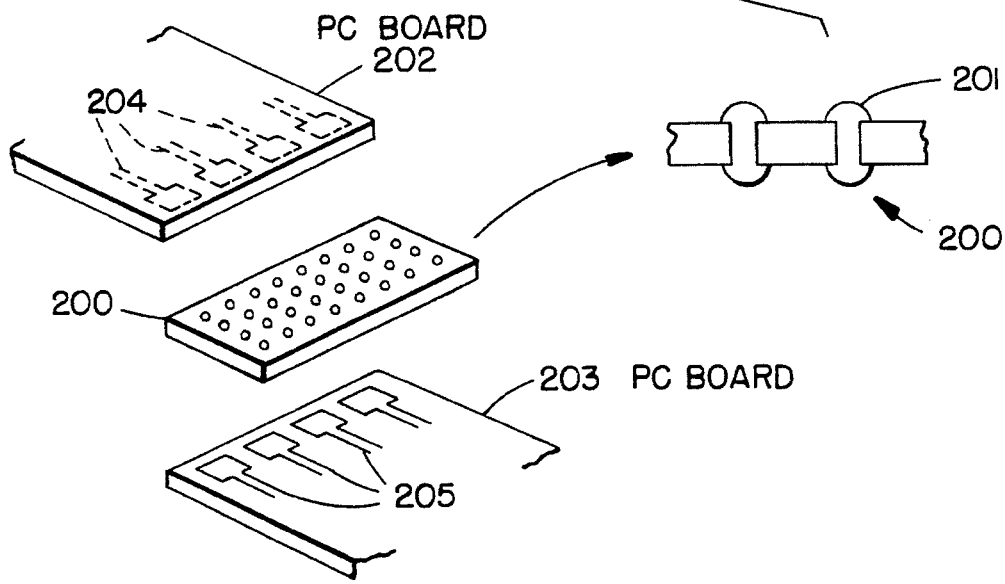
FIG. 18. (PRIOR ART)
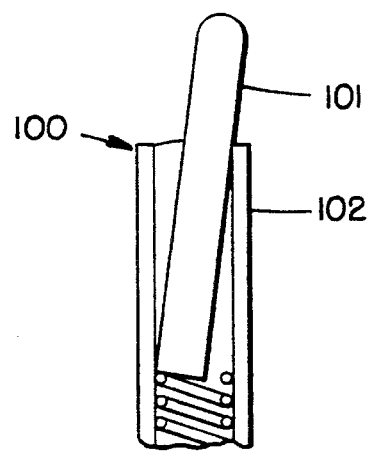
FIG. 17. (PRIOR ART)
FIG. 19A.
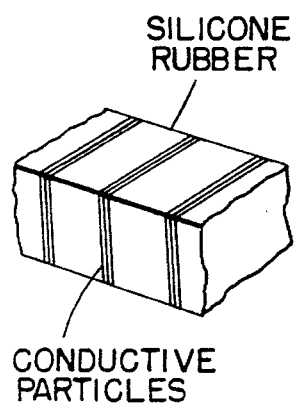
SILICONE RUBBER
CONDUCTIVE PARTICLES
FIG. 19B.
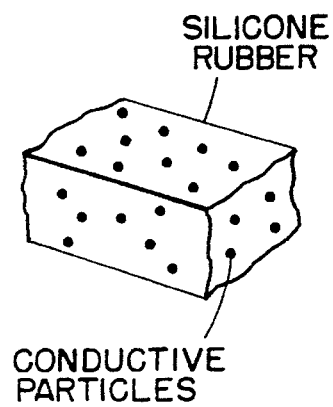
SILICONE RUBBER
CONDUCTIVE PARTICLES
FIG. 19C.
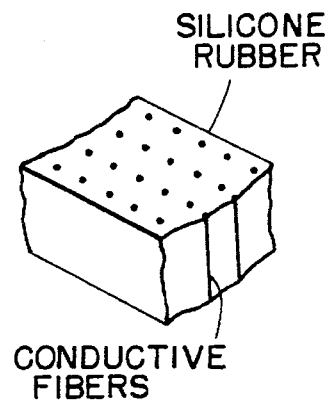
SILICONE RUBBER
CONDUCTIVE FIBERS

ELECTRICAL CONNECTION STRUCTURE

TECHNICAL FIELD OF THE INVENTION

This invention relates to an electrical connection structure which provides a high density connection with a conductor to be contacted and a contact of high reliability under low contact pressure, which is particularly superior in high frequency properties, and which reduces leak current generated at the contact.

Soldering is performed by methods such as hand soldering with a soldering iron, web soldering, reflow, infrared spot. Joining by brazing or with a conductive adhesive is used in cases where soldering is difficult.

Anisotropic conductive sheets had been used, for example, when IC chips are mounted on PC boards, without using soldering or sockets and when two PC boards are electrically connected. These anisotropic conductive sheets include sheets of an insulator and a dielectric, through which conductors penetrate, being formed on both sides and sheets having conductor line patterns which are formed its surface are used. Electrical conduction should be obtained when the sheet is pressed between the device and the PC board terminals.

For instance, electrical connection structures are known where anisotropic conductive sheet 200 through which conductive protrusions 201 penetrate and are formed on both sides are pressed between terminal groups 204 and 205 of two PC boards 202 and 203, as shown in FIG. 18, and mixing into or laminating of conductive material such as conductive rubber, conductive particles, conductive fibers into an elastic member (FIG. 18) by pressing mechanically and thermally therebetween in similar manner those shown in FIGS. 19 (A) to (C).

In addition, when electrical connection/disconnection between two conventional devices (electrical components, such as PC boards and ICs) becomes necessary, the aforementioned connection/disconnection is performed properly using an electrical connection means, such as a connector, socket, pin, probe. For instance, when ICs and M.C.M. (multi-chip modules) that have been sealed in a package, are to be electrically connected without soldering, a variety of IC sockets suitable for the package type are used. Furthermore, when cables and PC boards, etc., are to be connected without soldering, connectors and sockets of multiple metal electrodes formed in a housing are used.

Elastic connectors such as, for instance, those shown in FIG. 20, are also used. In FIG. 20, elastic connector 52 has Cu line patterns 54 with a width of 150 μm made of Au plating on an Ni substrate plating formed parallel on the surface of a dielectric film (polyimide film 52) as the substrate. This elastic connector 51 is made by winding film 52 around elastic rod 59 made from a soft silicone rubber. Terminal 302 of PC board 301 and line pattern 54 at the end of film 52 are aligned and pressed by a pressing means that is not illustrated in this drawing.

However, either such joining means and connection/disconnection means is inconvenient for the following masons. That is, while there is an advantage to connection by soldering in that a reliable, inexpensive electrical connection is obtained, the electrical properties of the mounted parts deteriorate and electrical properties inside and at the surface of the PC board change, leading to a reduction in reliability during heating process (and during subsequent washing process when washing is performed after soldering). Skill in sealing the parts is required in order to prevent changes in the electrical properties. Moreover, although current leakage must be kept to a minimum in precision measurements, such as DC parametric measurements, there is a problem in that when the parts, as well as the PC board itself, absorb water during the solder washing processes, insulation properties decrease and the circuit will not function properly.

There is a tendency toward restricting the use of organic solvents in terms of environmental pollution and since there are metals that are difficult to solder (such as Al), brazing is being used in place of soldering. However, as with soldering, the disadvantages of a decline in reliability with heating cannot be avoided.

Although conductive adhesives can be used relatively easily, these conductive adhesives are conductive material (usually metal powder) mixed in organic material and therefore, the resistance of the connections increases and the electrical properties will readily deteriorate. Moreover, since there is a chance that the adhesion will come off and adhered sites will deform by such deterioration over a period of time. Hard adhesive may additionally fill onto the outside of these joined components. However, these fillers disadvantageously would lead such deterioration in electrical properties (leakage current, pressure resistance, changes in dielectric factor of the joined components, etc.).

Since the self-inductance of the leads increases and cross talk is readily generated in electrical connections that use connectors, a strong tendency of deteriorating an electrical characteristics is shown and it would be very difficult to construct a highly dense structure which can retain an impedance characteristics of transmission path. The number of connection and disconnection would be limited, and when an oxide film or impurities are form on a terminal surface in which an electrical connection is accomplished, such connection would be readily damaged. Furthermore, since there would be a limitation in manufacturing a compact connection/disconnection mechanism, a high density can not be achieved due to a number of utilized terminals.

Moreover, although highly dense mounting is possible with the aforementioned contact sheet shown in FIG. 18 and contact materials shown in FIGS. 19(A) to (C), there would be a limitation for controlling a thickness during sheet manufacturing process and it is difficult to obtain a flat sheet with a thickness on the order of several μm. Therefore, a sufficient electrical connection can not be obtained by such non-heating pressing method. Under these circumstances, a heat pressing method is generally employed. However, this method requires an additional equipment, such as a heating device and yet cause a decline in a reliability due to hearing similar with a soldering and a brazing.

Since the surface of a line pattern 54 is smooth in the aforementioned connector shown in FIG. 20, when a surface oxide film, sulfide film, oil film, dust, etc., forms or is deposited on said line pattern 54 or the terminals of the board, which is the conductor to be contacted, electrical contact becomes incomplete. In order to prevent such incompleness in electrical contact, an appropriate contact pressure should be provided. However, when a number of poles is large (for example, an order of 10, even in a range of several hundreds to one thousand), for instance, a connection between pin cards of test head for IC tester and DUT board, such pressing mechanism may become very large and the cost for such mechanism will increases markedly. Furthermore, since polyimide film 52 has a high hygroscopic property, the leakage current increases and it is inappropriate for use in handling currents of 1 nA or less.

A sheet with conductor protrusions such as that in FIG. 21 can be also used in place of the film in FIG. 20. This sheet 61 with conductor protrusions has line pattern 64 formed on one surface of polyimide film 62 with adhesive layer 63 in between and conductor protrusions 66 extend line pattern 64 so that they project and are formed on the surface of polyimide film 62. By means of this sheet 61 with conductor protrusions, the convex ends of the conductor protrusions touch the terminal surface of the conductor to be contacted and therefore, a good contact can be obtained when compared to the case where flat terminals are pressed. However, since there is no elastic contact with the terminals of the conductor to be contacted, all of the microconductor protrusions cannot participate in electrical contact and there is therefore a problem in that electrical connection is insufficient.

Particularly, since contact cannot be sufficiently maintained when an oxide film, sulfide film, oil film, etc., forms on the surface of the terminals of the conductor to be contacted, there is a problem with poor reliability, and satisfactory electrical and mechanical properties cannot always be attained. In addition, since the leakage current of polyimide film is high, as previously mentioned, there is also a problem in that it is not suitable for use in handling a current of 1 nA or less, etc.

This invention relates to an electrical connection structure which provides a high density connection with a conductor to be contacted and a contact of high reliability under low contact pressure, which is particularly superior in high frequency properties, and which reduces leak current generated at the contact.

SUMMARY OF THE INVENTION

The object of the present invention is to solve aforedescribed conventional problems and to provide an electrical connection structure which yields the high density connection with the conductor to be contacted and high reliability, which is superior in high frequency properties, and a reduction in the DC leakage and furthermore the electrical connection and disconnection at low contact pressure.

[Summary of the Invention]

The electrical connection structure of this invention comprises flexible dielectric film, a first conductor pattern which is formed on the dielectric film, the first conductor pattern has one or plural microconductor protrusions at least on its contact surface which contacts with a conductor to be contacted; and an elastic member which mounted on the other side of the dielectric film, whereby an electrical connection is accomplished by pressing the contact surface against a conductor to be contacted.

When the diameter of microconductor protrusions is too large, they would be substantially same as flat terminals. Similar to large diameter, when the diameter is too small, there would be no difference from flat terminal and furthermore they would be difficult to manufacture. Therefore, the diameter of the microconductor protrusions should be in the range of 5 to 500 μm, preferably in the range of 10 to 100 μm.

Although there are no restrictions in the shape of microconductor protrusions as long as they perform an electrical contact, it is preferred that a tip portion is preferably curved with a rounded surface. A variety of conductor protrusions can be used, such as semispherical (including those with a convex curved face, such as semi-elliptic shapes) protrusions, protrusions that have a mushroom shape and whose end becomes semispherical when the first conductor pattern is established, protrusions whose end is mushroom-shaped, etc.

There can be several microconductor protrusions formed on a first conductor pattern in order to improve a reliability of the connection with a conductor to be contacted. In this case, when diameter is too small, there would be less contact points and when the diameter is too large, the number of conductor protrusions increases and thus create a difficulty in manufacturing. The density of microconductor protrusions, however, depends on the diameter of microconductor protrusions. Accordingly, when the density is measured by a pitch, the minimum pitch of semispherical protrusions can be 15 μm and the minimum pitch of the mushroom-shaped protrusions can be 20 μm. These values should not limit the present invention and even they can be selected in accordance with the size of the terminals of the conductor to be contacted.

In the electrical connection structure of the present invention, the number of semiconductor protrusions formed on a first conductor pattern may be one or more than one. Thus, at least one conductor protrusion formed on the first conductor pattern will contact one terminal of a conductor to be contacted to assure a contact of high reliability. Moreover, one or plural conductor patterns may associate with one terminal of a conductor to be contacted, with there being a plurality of a first conductor pattern. The contact surface of a first conductor pattern with a conductor to be contacted may also be a curved surface (for instance, convex or concave), with respect to said conductor to be contacted.

The tip portion of the microconductor protrusion may be extruded and an auxiliary layer may be formed at least around a perimeter of the microconductor protrusions on a first conductor pattern. Disposing such auxiliary layer, the pattern of the printed circuit itself can be protected. An insulating synthetic resin, such as polyimide may be used as the auxiliary layer. A second conductor pattern may further form between the dielectric film and the elastic member. This second conductor pattern can also serve as a signal line. It is normally used as the ground surface or guard surface.

The dielectric film may preferably have a dielectric constant of less than or equal to 6.0 at 1 MHz measured by the resonance perturbation method, a dielectric dissipation factor of 0.1 at 1 MHz measured by the resonance perturbation method of 1 MHz, and a volume resistivity of more than or equal to $10^{14} \Omega \cdot cm$. This dielectric film may be polytetrafluoroethylene (PTFE) resin and more preferably porous polytetrafluoroethylene (P-PTFE). In this case, the dielectric layer may be a single layer of PTFE resin or P-PTFE resin, or may be formed of multiple layers including PTFE or P-PTFE resin.

An elastic member can be a variety of shapes, such as sheets, blocks. It is possible to adjust a contact pressure by selecting an appropriate elastic member. Moreover, an elastic member may form a hollow or solid synthetic resin cylinder and the dielectric film (a conductor pattern having microconductor protrusions dispose within the film) may be wrapped around the synthetic resin cylinder. In particular, when the cylinder is hollow, the appropriate contact pressure with the terminal of the conductor to be contacted can be more easily obtained by adjusting the diameter of a hollow portion. Moreover, a variety of shapes, such as elliptical shapes, rectangles whose corners appear round, triangles can be used as the elastic member. Furthermore, an elastic member may be a coil spring cylinder in which a coil is wounded at an angle. Elastic member pushes the conductor to be contacted, however, different pushing means, such as a spring, can also be used with the elastic member.

In accordance with the present invention, various layers, such as adhesive layers for joining with an elastic member, synthetic resin layers, glass layers and conductor layers for eliminating leakage current between line patterns, prevention of cross talk, reinforcing mechanical strength may be provided on the opposite side of the surface of the synthetic resin film on which microconductor protrusions are formed in this invention.

A synthetic resin cylinder or a coil spring cylinder and a dielectric film may be supported on a guide which includes a side wall that stands at an angle in a direction of pressing the synthetic resin cylinder and the dielectric film against a conductor to be contacted, thereby the contact surface of the first conductor pattern moves along in a plane of the contact surface when a force of the pressing varies.

The present invention will now be explained with attached drawings. The characteristic features are enlarged for an explanation purpose in these drawings (FIGS. 1 through 6 and FIGS. 7 through 16, which show various embodiments of the invention). Dimension may therefore differ from an actual size.

In accordance with the present invention, in case the microconductive protrusions contact with a terminal of a conductor to be contacted, a positional relation of microconductor protrusions to a terminal to be contacted may vary from when contact is initiated to when contact is completed, a contact of high reliability may be accomplished with a scratching operation (which will be referred as "scratching" in a following description) in which a thickness of pressing force and a distance of movement are controlled when the microconductor protrusions contact with terminals of a pad or a line pattern of the conductor to be contacted.

Contact terminal 1 of FIGS. 1 (A) and (B) has a curved contact surface, a dielectric film 11 having a first conductor pattern (line pattern 13 having microconductor protrusions B1 and B2) on its surface, which is formed on an elastic member 3 normally without adhesion. When the contact terminal 1 is pushed against a flat terminal surface of the conductor 2 to be contacted, a linear distance between a point of contact for microconductor protrusion B1 and B2 will change from Lb0 shown in FIG. 1 (A) which is prior to pushing to Lb1 shown in FIG. 1(B). That is, the distance between microconductor protrusions changes by Lb0→Lb1 (Lb0<Lb1), and a scratching is produced to provide complete a contact.

This scratching can also be generated by a mechanism such as shown in FIGS. 1(C) and 1(D). The contact terminal 1 has a flat contact surface and includes an elastic member 3 is disposed in underneath of the contact surface. In this case, the distance between B1 and B2, which is Lb0 when contact is initiated (FIG. 1(C), becomes Lb1 after contact is completed (FIG. 1(D)) because a portion between B1 and B2 is deformed to a convex shape. That is, the distance between microconductor protrusions changes by Lb0→Lb1 (Lb0>Lb1) and as in FIGS. 1 (A) and (B), scratching is produced and a contact is completed.

Furthermore, it is understood that such mechanism shown in FIG. 1(C) and 1(D) may be additionally appeared during a contact described with FIG. 1(A) and 1(b).

This change in a linear distance is created by deforming a convex portion between microconductor protrusions B1 and B2 of the elastic member 3 to a flat portion and thus scratching is produced as shown in FIGS. 2 (A) and 2(B).

That is, when a film (oil film or oxide film) P is formed on a terminal surface of the conductor 2 to be contacted, an electrical contact between the microconductor protrusion B and the conductor 2 to be contacted may not be sufficient when pushing is started (FIG. 2(A)), however, as such pushing proceeds, a tip portion of the microconductor protrusion B is displaced in the direction of an arrow along a contact surface and a film P is scraped off. Therefore, an electrical contact can be assured between a contact terminal and the conductor 2 to be contacted (FIG. 2(B)).

Scratching may be generated by a displacement of a tip portion of the microconductor protrusions in a plane of the contact surface while the microconductor protrusions are pushed against the terminal surface of conductor 2 to be contacted as previously described. Furthermore, scratching may also be accomplished by slightly rotating a contact point around a point of support (such rotation is shown by arrows) while a top portion of the microconductor protrusion B contacts a terminal surface of the conductor 2 to be contacted, as shown in FIG. 3(A). Moreover, as shown in FIG. 3 (B), the direction of a surface can be changed slightly ($\theta$) in order to provide a large displacement of a tip portion of the microconductor protrusions ($\delta$) by forming a rod of microconductor protrusion B (mushroom shape shown in FIG. 3(B)).

In addition, such scratching may be effectively generated by enclosing a hollow or solid elastic member (synthetic resin cylinder or spring) which is wound with a dielectric film on which conductor patterns having microconductor protrusions been formed in a housing of a specific shape, and compressing the elastic member within a housing.

FIGS. 4 (A) and 4(B) show the terminal material 1 is enclosed within rectangular-shaped housing in which an elastic member 3 forms hollow and FIGS. 4(C) and 4(D) show the terminal material 1 is enclosed within a housing having a V-shaped cross section space. Here, the characteristics of a stroke (pushing distance) and a pushing pressure can be adjusted by suitably establishing a thickness of the elastic member 1 which is formed of a hollow. As a result, good contact can be obtained between the microconductor protrusions B and the conductor 2 to be contacted. Furthermore, a pressing pressure may also be adjusted by selecting an appropriate material to form an elastic member 1.

FIGS. 4(E) and 4(F) show a contact terminal 1 is enclosed within a housing 4 having a housing space is asymmetric (a cross section has four parallel sides). This type of housing 4 allows the contact terminal 1 entirely move in parallel to a contact surface and therefore, a tip portion of microconductor protrusions B at a contact surface with the conductor 2 to be contacted may be properly displaced along a contact surface while it is pressed against a contact surface. Furthermore, the microconductor protrusions B are formed on a contact portion of the conductor 2 to be contacted in FIGS. 4(E) and 4(F).

FIG. 4 shows hollow elastic member 3. A variety of elastic member may be used, such as a material in which the cross section is round as shown in FIG. 5(A), a material where the cross section is elliptical as shown in FIG. 5(B), a material where the cross section is a quadrangle, as shown in FIG. 5(C), a material where the cross section is a semicircle, as shown in FIG. 5(D), and a material where the entire shape is flat, as shown in FIG. 5(E). If a hollow elastic member is used, a cross section may be properly varied and the axis of a cylinder and a hole may also be varied.

FIGS. 6 (A) and 6(B) are an elevational view and side view of an elastic member 3' which forms a coil spring slanted wound. In use of coil spring, the relation between a pushing pressure and a displacement of a pushing direction becomes linear. Therefore, a good contact can be obtained by pushing mechanism.

BRIEF DESCRIPTION OF THE DRAWINGS

FIGS. 4 (C) and (D) show another embodiment of a contact terminal which is enclosed in a V-shaped housing.

FIGS. 4 (E) and (F) show another embodiment of a contact terminal which is enclosed a U-shaped with a parallelogram cross section housing.

FIG. 8 (B) shows a top view of FIG. 10.

FIG. 14 shows another embodiment of a contact terminal in which a hollow synthetic resin cylinder of silicone rubber is wrapped around a sheet with microconductor protrusions.

FIG. 15 is an enlarged view for an electrical connection structure of the present invention between pin cards in IC tester and a test head.

FIG. 16 shows plural contact terminals of FIG. 18 implemented in a test head.

FIG. 17 shows a conventional spring contact pin.

FIG. 18 shows a connection using a conventional contact sheet.

FIG. 19 shows various contacting materials.

PREFERRED EMBODIMENTS OF THE INVENTION

Figure 1A:
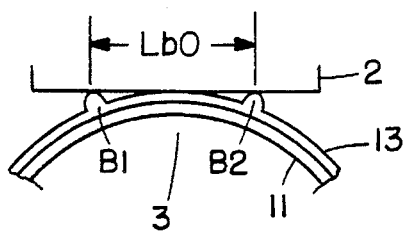
FIG. 1 shows a scratching motion of a contact terminal in accordance with the present invention. (A) shows a state of the contact terminal when a contact is initiated and (B) shows a state of the contact terminal when a contact is completed. Figs. (C) and (D) show additional contact state.
Figure 1C:
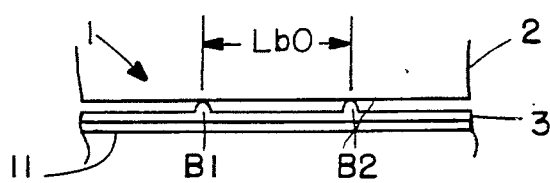
Figure 1B:
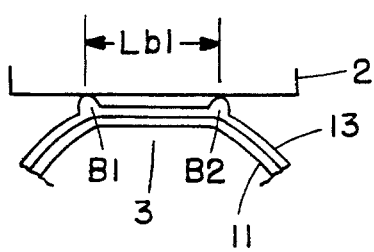
Figure 1D:
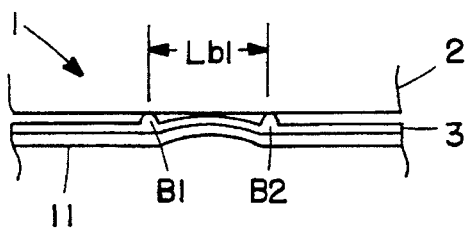
Figure 2A:
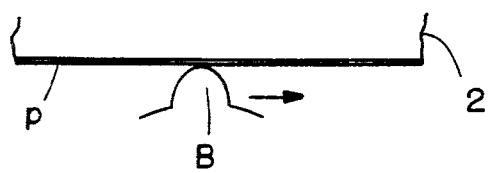
FIG. 2 shows a scratching motion of a contact terminal in accordance with the present invention. (A) and (B) show an elimination of an oxide film by contact with a scratching motion.
Figure 2B:
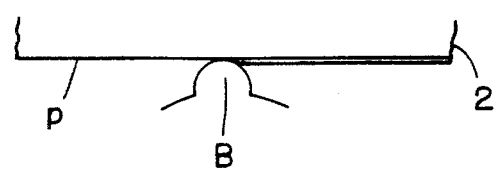
Figure 3A:
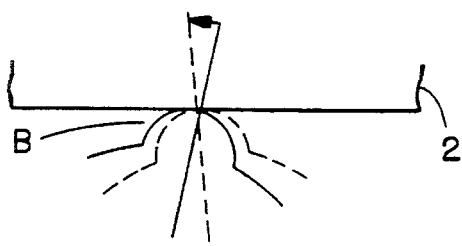
FIG. 3 (A) shows another embodiment of scratching motion by slightly rotating a contact point of microconductor protrusion and FIG. 3 (B) shows a mushroom shaped microconductor protrusion.
Figure 3B:
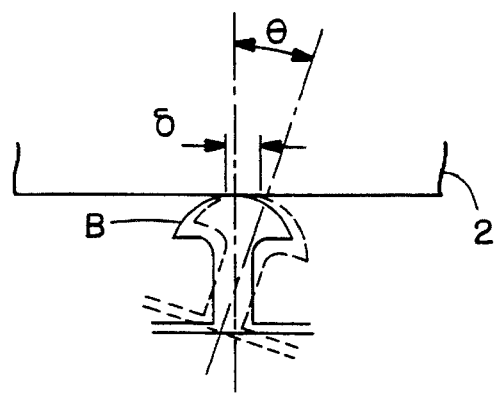
Figure 4A:
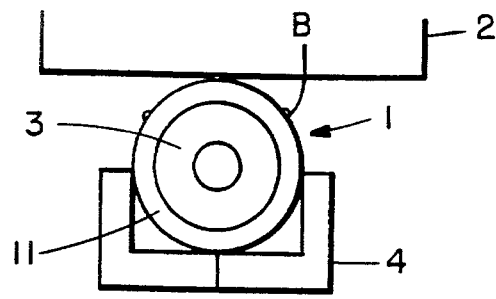
FIGS. 4 (A) and (B) show one embodiment of a contact terminal which is enclosed in an U-shaped housing.
Figure 4B:
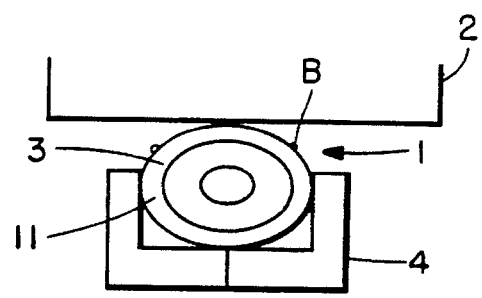
Figure 4C:
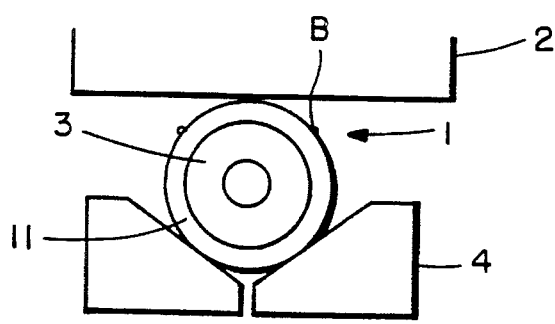
Figure 4D:
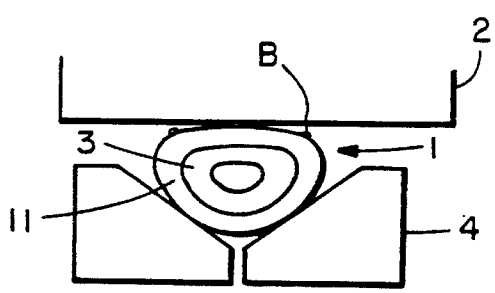
Figure 4E:
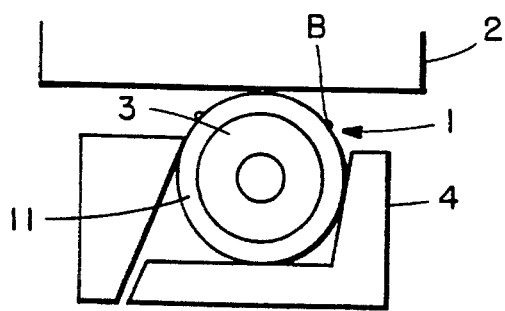
Figure 4F:
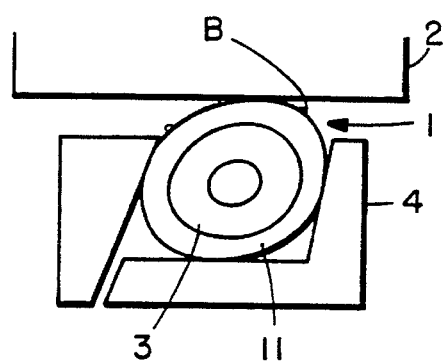
Figure 5A:
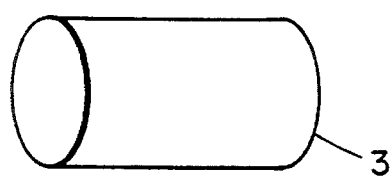
FIG. 5 show an elastic member with various rod-shapes.
Figure 5B:
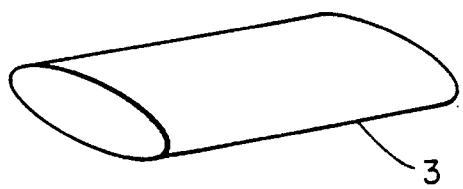
Figure 5C:
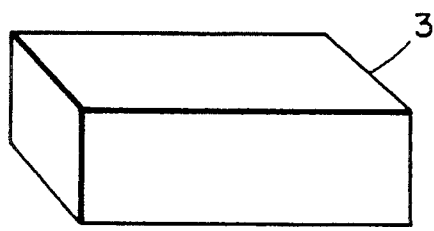
Figure 5D:
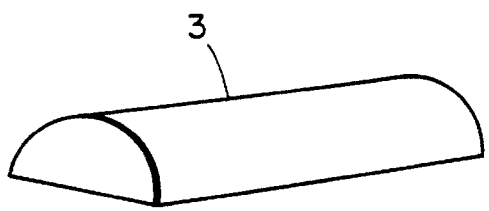
Figure 5E:
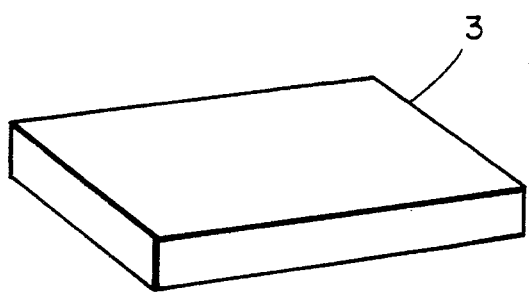
Figure 6A:
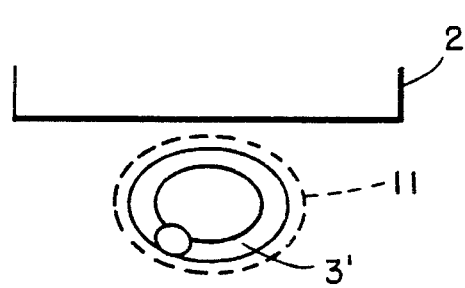
FIG. 6 shows a coil spring in which a coil is wounded at an angle.
Figure 6B:
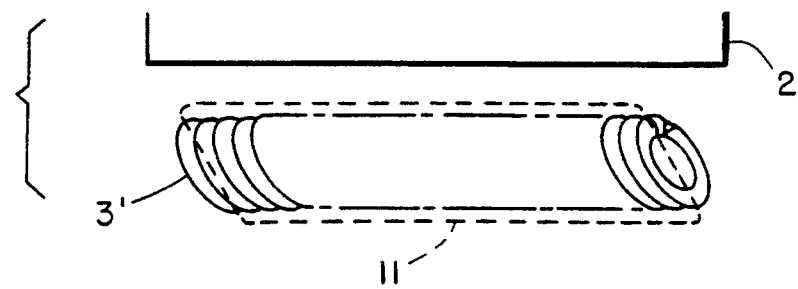
Figure 7:
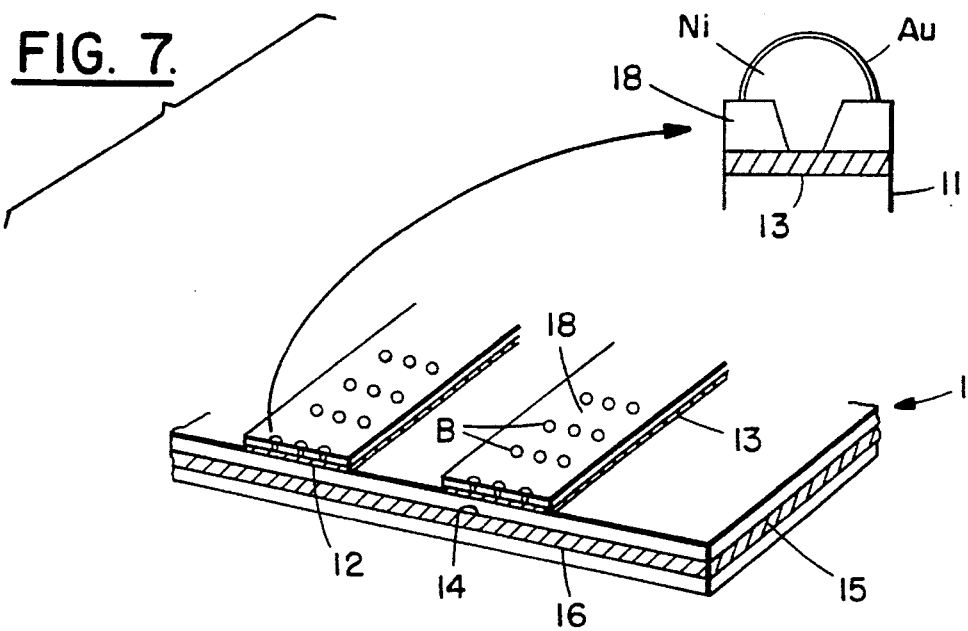
FIG. 7 is a cross section of one embodiment of a contact terminal of this invention.

FIG. 7 shows one embodiment of a contact terminal 1 of the present invention. In this drawing, a first conductor pattern (line pattern 13) is formed on one side of flexible dielectric film 11, which is made of P-PTFE film, by an adhesive layer 12, and a plurality of microconductor protrusions B are formed on a surface of this line pattern 13.

In this embodiment, the line patterns 13 are made of Cu, and the line patterns 13 form in an equal distance. Pitch may be a minimum of 180 to 200 μm. The width of the line patterns 13 can be formed to a minimum of 80 to 150 μm. By adjusting the width of line patterns 13 properly, an impedance matching can be readily performed.

Second conductor pattern (becomes a ground or a guard) 15 is formed on the surface opposite the surface of dielectric film 11 on which the line patterns 13 are formed by an adhesive layer 14 therebetween, and an elastic layer 17 is formed on this conductor pattern 15 by an adhesive layer 16. Moreover, a tip portion of microconductor protrusion B are extruded and an auxiliary layer 18 is formed around the microconductor protrusions B on line pattern 13. Furthermore, an auxiliary layer 18 is used for protecting the line pattern 13 and may be optionally omitted. Adhesive layers 14 and 16 may be optional. In particular, when adhesive layer 16 is not used, a second conductor pattern 15 and an elastic layer 17 can easily slide and the flexibility of contact terminal 1 can be maintained.

Microconductor protrusion B is a mushroom shape that is formed by, for instance, coating Ni (other metals, such as Sn, Fe, Rh can be used in place of Ni) on Au and form a regular lattice shape. The microconductor protrusions are arranged on line pattern 13 (in two rows). Furthermore, in FIG. 7, size of microconductor protrusions B and thickness of each layer are exaggerated for an explanation purpose, and which are actually very small that they can not distinguish macroscopically. Diameter, height, and pitch of microconductor protrusions B may be, for example, 80 μm, 35 μm and 250 μm, respectively. Moreover, the width of line pattern 13 may be 100 μm. In addition, thickness of line pattern 13 and the second conductor pattern may be established properly and are, for instance, 18 to 70 μm. Similarly, thickness of the dielectric film 11 is suitably selected and is, for instance, several ten μm to several mm.

Figure 8A:
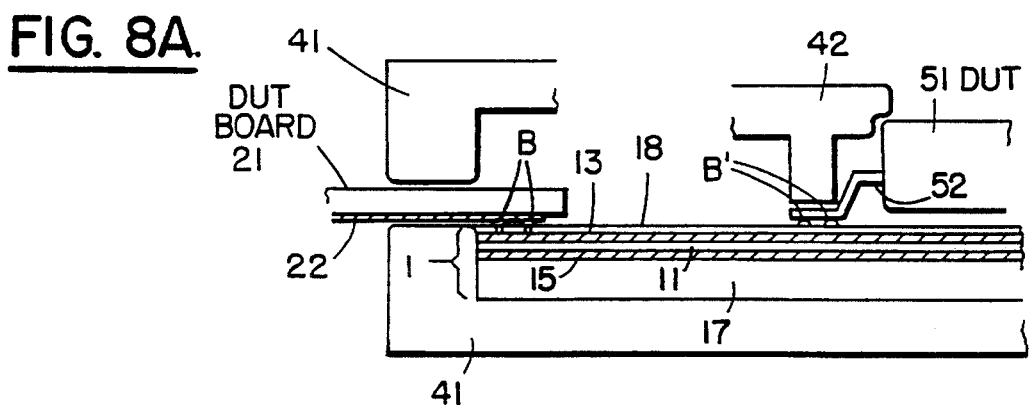
FIG. 8 (A) shows a contact terminal of FIG. 7 used in a connection between DUT and DUT board for IC tester.
Figure 8B:
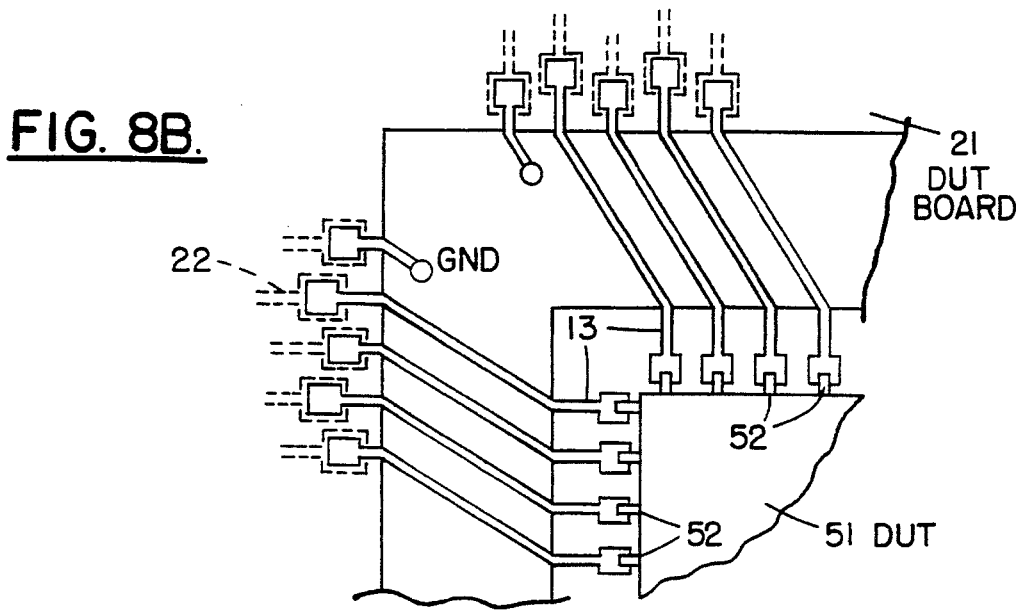
Figure 9:
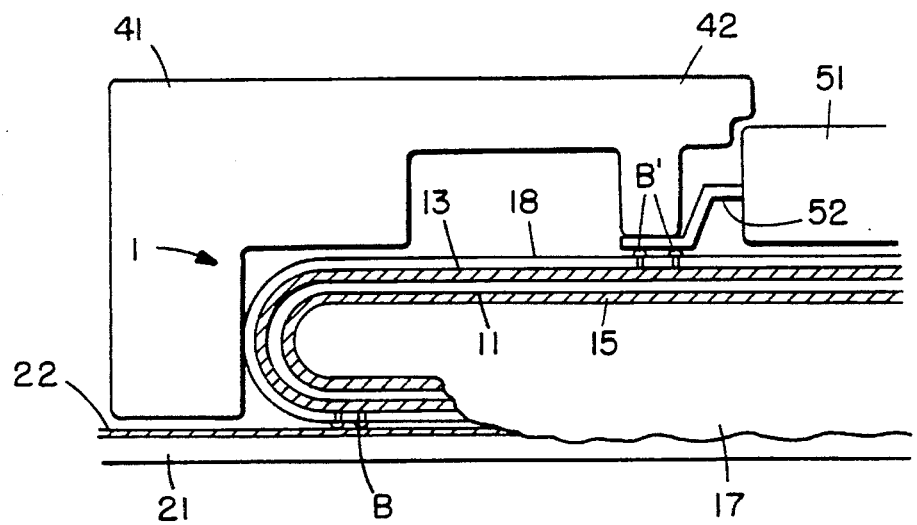
FIG. 9 shows another embodiment for a contact terminal of FIG. 7 used in a connection between DUT and DUT board of IC tester.
Figure 10:
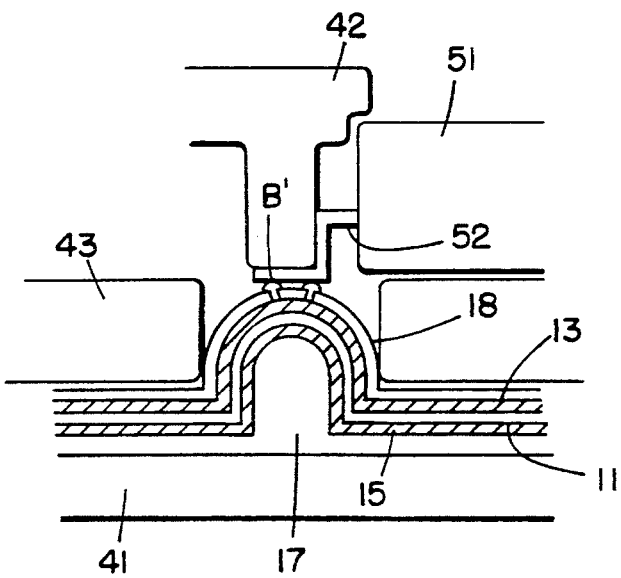
FIG. 10 shows another embodiment for a contact terminal of FIG. 7 used in a connection between DUT and DUT board of IC tester.

FIGS. 8 through 10 shows several embodiment for IC connection where terminals are aligned in an outer circumference of chips (QFP, TAB, LCC). That is the contact terminal 1 with a laminated structure in FIG. 9 is used for connection of DUT boards and DUTs for IC testers.

In FIG. 8(A), DUT board 21 is fixed to housing 41 and line pattern 22 that has been formed on one side of the DUT board 21 is pushed to contact microconductor protrusion B at the end of line pattern 13 of contact terminal 1 within the housing 41. Moreover, lead pushing guide (stationary part of the DUT) 42 pushes the end of lead 52 of DUT 51 and microconductor protrusion B' at the end of line pattern 22 of contact terminal 1. FIG. 8(B) shows the top view of the connected state in FIG. 8(A).

FIG. 9 shows one preferred embodiment in which the present invention is applied in connection of the DUT board and the DUT for an IC tester. Contact terminal 1 is formed by bending sheets with microconductor protrusions (dielectric film on which conductor patterns with microconductor protrusions have been formed) and then forming an elastic layer 17 on the inside of bent portion. Moreover, bent portion of the sheets with microconductor protrusions are sandwiches between DUT board 21 and housing 41.

FIG. 10 shows another embodiment where a terminal of a contact terminal 1 (sandwiches between plates 43) is protruded, and lead pushing guide 42 pushes a tip portion of lead 52 and terminal 52 of DUT 51.

Figure 11:
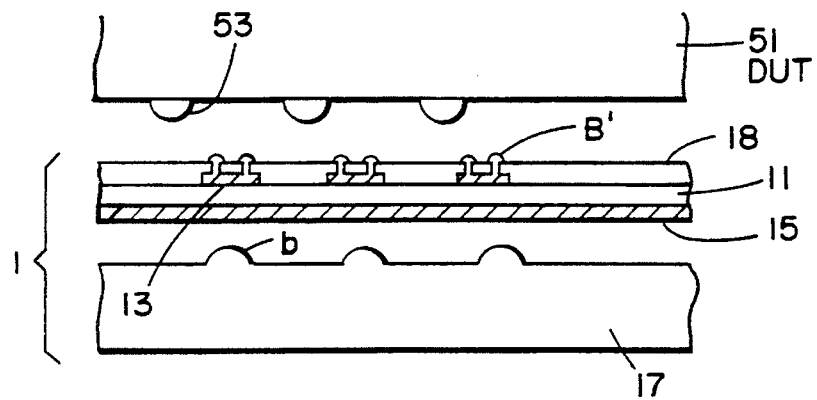
FIG. 11 shows another embodiment of a contact terminal which includes a thick contact region for a terminal of an elastic member and a terminal of DUT.
Figure 12A:
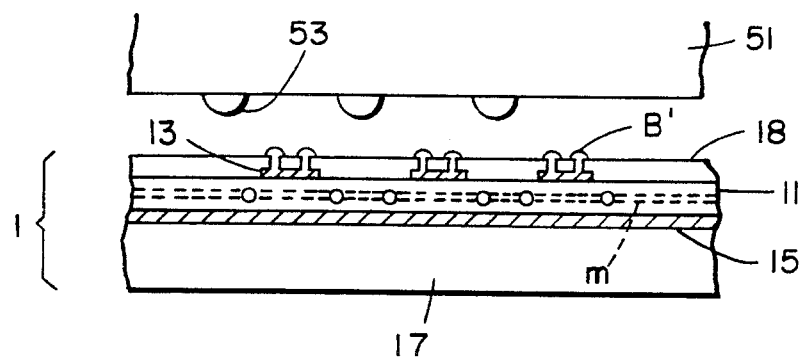
FIG. 12 shows another embodiment in which a glass fiber mesh is embedded in a dielectric layer.
Figure 12B:
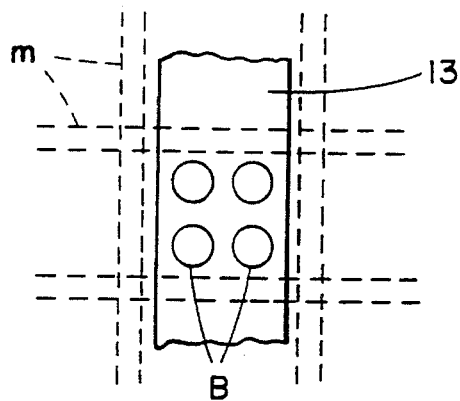
Figure 13:
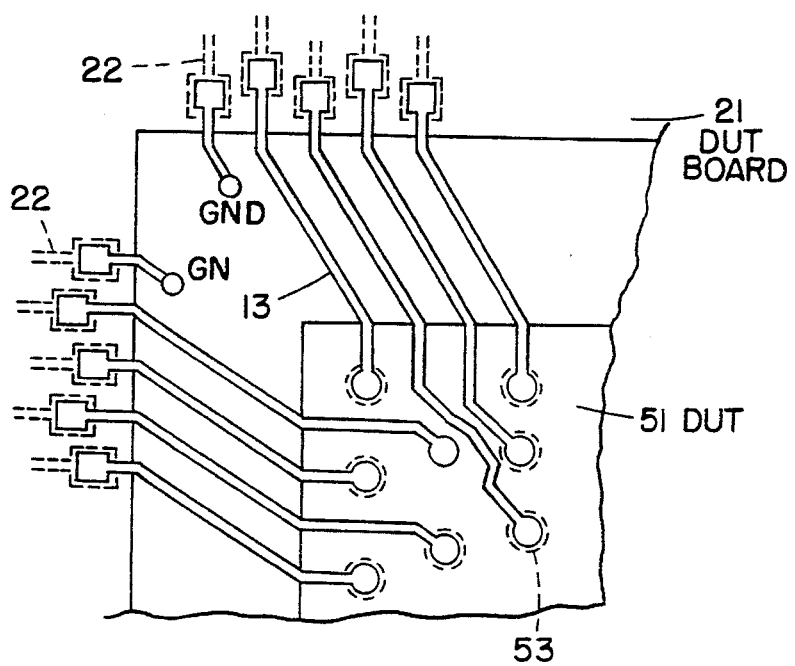
FIG. 13 is a top view of FIGS. 14 and 15.

FIGS. 11 through 13 show another embodiment for DUT connection where terminals are aligned on a base of the chips (BGA, LGA types).

In FIG. 11, a contact portion between a terminal on the side of the contact terminal 1 and a convex terminal 53 of DUT 51 of an elastic layer 17 may be thick (this thickness is made with a protrusion b). In FIG. 12(A) (lateral cross section) and (B) (top diagram), glass fiber mesh m is embedded in the dielectric layer 11 and the center of quadrangle of mesh m is positioned at the contact part between a convex terminal 53 on the side of the contact terminal 1 and a terminal of the DUT 51 of the elastic layer 17.

Scratching effects are produced by joining a terminal on the side of the contact terminal 1 to a terminal 53 so that it is deformed to a convex shape as shown in FIG. 11, or by joining this terminal to a terminal 53 so that it is deformed to a concave shape as shown in FIG. 12. FIG. 13 shows an elevational view of the connection in FIGS. 11 and 12.

Even when fine dust is deposited on a contact surface of the contact terminal 1 in FIG. 9, dust would fall off by scratching effect that will be discussed later, or it is pushed into a convex part between microconductor protrusions B and B. Therefore, comparing to conventional contact sheets and contact materials where a surface of a line pattern 13 is smooth (FIGS. 20 to 23), the present invention allows a contact with very high reliability. Moreover, microconductor protrusions B may contact in at least one point, however, a multi-point contact of two or more points when contact is completed (for instance, 16, 32 . . . ) provides more reliable contact.

FIG. 14 shows another embodiment of the contact terminal 1 of the present invention in which a sheet with microconductor protrusions is wound around a hollow synthetic resin cylinder made of silicone rubber as shown with 19 (such sheet is wound once so that a line pattern 13 is aligned along a circumference of synthetic resin cylinder 19). Terminals of the sheet with microconductor protrusions overlap each other, a synthetic resin cylinder 19 is arranged on a bent portion of the sheet associated with microconductor protrusions and their both ends extend to form a flap F. Although not shown in a drawing, the microconductor protrusions B are only provided only at a portion of the line pattern 13 which will contact with terminals of the conductor to be contacted. Furthermore, microconductor protrusions B may be provided over entire portion of the line pattern 13.

FIG. 15 shows another embodiment of an electrical connection structure between a pin card and a DUT board within a test head for IC tester. Housing 4 of highly insulating plastic, such as PAS, PTFE, ETFE comprises an elongated part 45 along a direction over a length of the contact terminal 1 in FIG. 14 and an elongated part 46 wherein its vertical cross section forms a crank. They are joined and has an opening on a top portion and a slot 47 is formed at the bottom. Slot 47 is provided an electrical connection between a terminal 26 of a pin card 25 and flap F, which will be described later. The overlapping part is compressed by securing both housings 45 and 46 by means of a screw. A side of a cylindrical part of the contact terminal 1 partially extrudes over an opening and is housed in housing 4. This protrusion further contacts with a terminal 22 of PC board 21.

In accordance with an electrical connection structure shown in FIG. 15, the facts of an elasticity of the contact terminal 1 and microconductor protrusions B secures a contact with a terminal 22 of the conductor to be contacted (PC board 21) will affect mutually to accomplish a scratching operation as previously described in FIG. 1.

FIG. 16 shows pin cards that have been connected to contact terminals 1 in FIG. 15 being inserted into a multiple pairs 48 and 48 of card guides.

In a conventional test head for IC testers, such electrical contacts are generally accomplished with spring contact pins (pins where a terminal actuated by a spring force) and forcing a plurality of pins deposed on an upper surface of a test head body contact with a bottom surface on a pad of DUT board. Commonly, the number of such contact pins are in an order of a hundred to a thousand, which are used as an interface. Singular pin is necessary for one terminal of the DUT, however, such pin itself requires a certain thickness and since a socket may be required for mounting such spring pins, there would be a severe limitation in a number of electrodes per unit length and unit area. Therefore, there are limits to the number of poles per unit length and unit surface area. Pushing force per unit pin is, for instance, 20 to 50 g, and when the number of pins is increased, a force received by DUT board will increase and the structure that supports these contacts also will be very large. Such conventional test head of IC testers may be explained in U.S. Pat. No. 4,899,106 entitled "Personality Board" by M. Ogura, U.S. Pat. No. 4,975,639 entitled "Test head with Improved Shielding" by K. Hiwada et al and U.S. Pat. No. 5,295,853 entitled "Mechanism for Removably Mounting DUT Board on Test Head" by K. Nagakusa et al and all of which should be incorporated with herein by a reference.

By utilizing the contact terminal as previously described being formed on the upper surface of test head, an electrical connection structure for a test head can be obtained with high density of poles and low contact pressure.

Although one individual contact portion (actually a spring contact pin) is necessary for one terminal (pole) of a conventional DUT, the present invention will allow a contact with a plural poles for one contact terminal. That is, the mechanism for assuring a contact may not be independent for a number of poles and thus the size of this mechanism can be reduced. Consequently, the number of poles used per unit length and unit surface area can be increased considerably.

Figure 20:
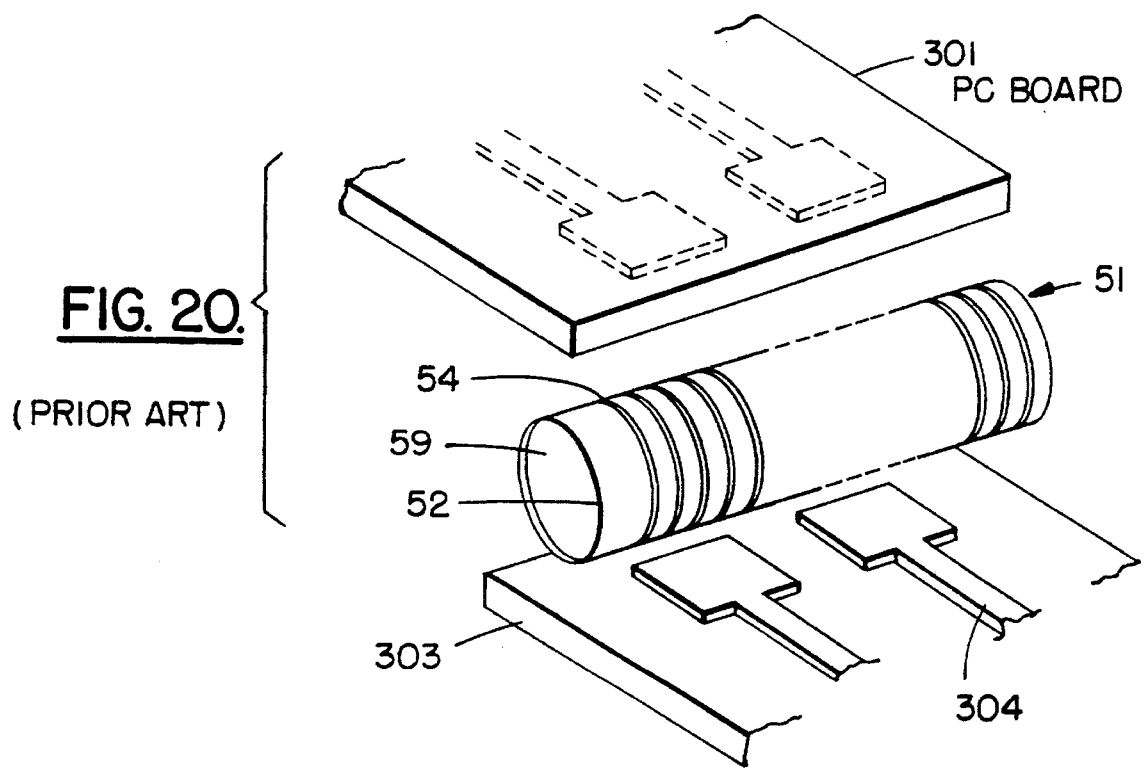
FIG. 20 shows one application for a conventional elastic connector.
Figure 21:
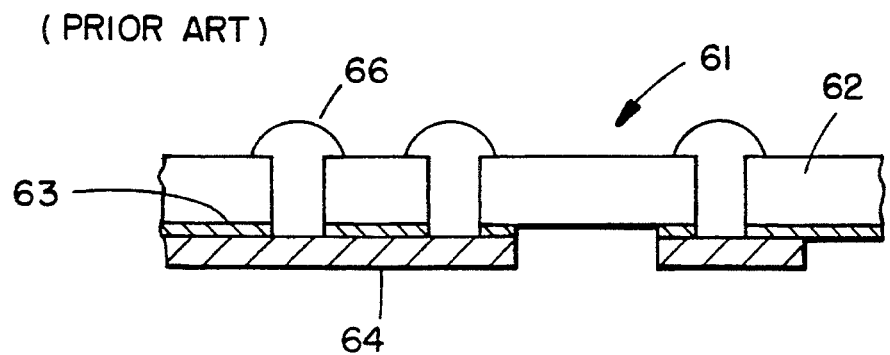
FIG. 21 shows a conventional sheet having microconductor protrusions.

As shown in FIG. 20, a conventional spring contact pin 100 conducted an electrical contact between movable pins 101 and tubes 102 by contacting a movable pin 101 with a tube 102 which encloses said movable pin (a contact by a press force which is perpendicular to the direction of movement of pins). That is, an extreme pushing force will be necessary in order to assure a contact by converting a force in the direction of movement of a pin to the direction perpendicular to said direction. In the contrary, in the present invention, the force exerted to DUT board will not be so enormous even with an increase in poles and therefore, a contact can be sufficiently maintained a use of a large pushing mechanism.

Following advantages may by attained with an electrical connection structure constructed in accordance with the present invention described above.

(1) An electrical contact with high reliability can be achieved between boards or between an electronic component and a board under low contact pressure. That is, a fix connection and a long life can be accomplished with a simple structure by microconductor protrusions of the invention (scratching effect, multi-point contact effect etc.).

(2) Multiple high-density mounting is possible. Thus, the present invention can be used for a variety of purposes, such as electrical connection of electronic components and an application in sockets of IC cards for small electronic devices. In addition, for an application for a connection between a pin card and DUT board for IC tester, a density may be improved with more than an order of 5 to 10 in comparison with a conventional spring contact pins.

(3) The present invention provides a high electrical performance. That is, a leakage can be reduced considerably when a fluorine resin film is used as the dielectric film. Impedance matching can be easily accomplished by adjusting the width of the line pattern, adjusting dielectric film thickness and selecting an appropriate dielectric film materials. Ground and guard may be formed separately from microconductor protrusions and conducting line patterns and therefore, it can easily prevent cross talk and reduce leakage current.

(4) Maintenance is simple in comparison with a conventional connectors, sockets, pins, and probes. Although accidents such as folding of the pin or probe due to a failure in manipulation can not be prevented with a conventional structures, these problems rarely occur with the structure of the present invention.

Moreover, comparing to a conventional connectors, sockets, a decline in cost may be expected.

(5) The present invention accordingly can be used for a variety of purposes which meet these advantages of (1) to (4).

What is claimed is:

1. An electrical connection structure comprising:
a flexible dielectric film, including a surface to be contacted and an opposed surface;
a conductor pattern formed on said surface to be contacted of said dielectric film, said conductor pattern including at least one mushroom-shaped protrusion for providing electrical contact to a further conductive surface; and
an elastic member mounted on the opposed surface of said dielectric film, for causing an electrical connection to be made when the surface to be contacted and said further conductive surface are brought into pressure contact.

2. Electrical connection structure as in claim 1, wherein the diameter of said microconductor protrusions is in the range of 5 to 500 μm.

3. Electrical connection structure as in claim 1, wherein a plurality of said first conductor pattern are provided and each of said conductor pattern associates with a single terminal of a conductor to be contacted.

4. Electrical connection structure as in claim 1, wherein said contact surface of said first conductor pattern is a curved surface facing said conductor.

5. Electrical connection structure as in claims 1 further comprising an auxiliary layer which is provided at least on a perimeter of said microconductor protrusions of said conductor pattern, wherein a tip portion of said microconductor protrusions is extruded over said auxiliary layer.

6. Electrical connection structure as in claim 1 further comprising a second conductor pattern which is disposed between said dielectric film and said elastic member.

7. Electrical connection structure as in claims 1, wherein said dielectric film has a dielectric constant of less than or equal to 6.0 at 1 MHz measured by a resonance perturbation method, and a dielectric dissipation factor of less than or equal to 0.1 as measured by the resonance perturbation method, and a volume resistivity which is more than or equal to $10^{14} \Omega \cdot cm$.

8. Electrical connection structure as in claim 1, wherein said dielectric film is comprised of a porous polytetrafluoroethylene resin.

9. Electrical connection structure as in claim 1, wherein said elastic member is a hollow synthetic resin cylinder and said dielectric film is wrapped around said synthetic resin cylinder.

10. Electrical connection structure as in claim 1, wherein said elastic member is a solid synthetic resin cylinder and said dielectric film is wrapped around said synthetic resin cylinder.

11. Electrical connection structure as in claim 1, wherein said elastic member is a coil spring cylinder and said dielectric film is wrapped around said coil spring.

12. Electrical connection structure as in claim 9, wherein said synthetic resin cylinder and said dielectric film are supported on a guide, said guide includes a side wall which stands at an angle in a direction of pressing said synthetic resin cylinder and said dielectric film against said conductor to be contacted, thereby said contact surface of said first conductor pattern moves along in a plane of said contact surface when a force of said pressing varies.

13. Electrical connection structure as in claim 10, wherein said synthetic resin cylinder and said dielectric film are supported on a guide, said guide includes a side wall which stands at an angle in a direction of pressing said synthetic resin cylinder and said dielectric film against said conductor to be contacted, thereby said contact surface of said first conductor pattern moves along in a plane of said contact surface when a force of said pressing varies.

14. Electrical connection structure as in claim 11, wherein said coil spring cylinder and said dielectric film are supported on a guide, said guide includes a side wall which stands at an angle in a direction of pressing said synthetic resin cylinder and said dielectric film against said conductor to be contacted, thereby said contact surface of said first conductor pattern moves along in a plane of said contact surface when a force of said pressing varies.

15. Electrical connection structure as in claim 1, wherein said dielectric film is comprised of a polytetrafluoroethylene resin.

* * * * *